United States Patent
Coyle et al.

(10) Patent No.: US 7,084,494 B2
(45) Date of Patent: Aug. 1, 2006

(54) SEMICONDUCTOR PACKAGE HAVING INTEGRATED METAL PARTS FOR THERMAL ENHANCEMENT

(75) Inventors: Anthony L. Coyle, Plano, TX (US); William D. Boyd, Plano, TX (US); Chris Haga, McKinney, TX (US); Leland S. Swanson, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 71 days.

(21) Appl. No.: 10/871,645

(22) Filed: Jun. 18, 2004

(65) Prior Publication Data

US 2005/0280124 A1 Dec. 22, 2005

(51) Int. Cl.
*H01L 23/34* (2006.01)
(52) U.S. Cl. ............ 257/712; 257/713; 257/720; 257/787; 257/796
(58) Field of Classification Search .......... 257/706, 257/707, 712, 713, 720, 787, 796
See application file for complete search history.

(56) References Cited

U.S. PATENT DOCUMENTS 6,933,602 B1 * 8/2005 Patel et al. ............... 257/712

* cited by examiner

*Primary Examiner*—Thien F. Tran
(74) *Attorney, Agent, or Firm*—Yingsheng Tung; Wade James Brady, III; Frederick J. Telecky, Jr.

(57) ABSTRACT

A semiconductor device comprising a metallic leadframe (103) with a first surface (103*a*) and a second surface (103*b*). The leadframe includes a chip pad (104) and a plurality of segments (107); the chip pad is held by a plurality of straps (105), wherein each strap has a groove (106). A chip (101) is mounted on the chip pad and electrically connected to the segments. A heat spreader (110) is disposed on the first surface of the leadframe; the heat spreader has its central portion (110*a*) spaced above the chip connections (108), and also has positioning members (110*b*) extending outwardly from the edges of the central portion so that they rest in the grooves of the straps. Encapsulation material surrounds the chip, the electrical connections, and the spreader positioning members, and fills the space between the spreader and the chip, while leaving the second leadframe surface and the central spreader portion exposed.

16 Claims, 2 Drawing Sheets

SEMICONDUCTOR PACKAGE HAVING INTEGRATED METAL PARTS FOR THERMAL ENHANCEMENT

FIELD OF THE INVENTION

The present invention is related in general to the field of electrical systems and semiconductor devices and more specifically to thermally enhanced semiconductor devices having integrated metallic chip support and heat spreader.

DESCRIPTION OF THE RELATED ART

Removing the thermal heat generated by active components belongs to the most fundamental challenges in integrated circuit technology. Coupled with the ever shrinking component feature sizes and increasing density of device integration is an ever increasing density of power and thermal energy generation. However, in order to keep the active components at their low operating temperatures and high speed, this heat must continuously be dissipated and removed to outside heat sinks. This effort becomes increasingly harder, the higher the energy density becomes.

In known technology, one approach to heat removal, specifically for devices with metallic leads, focuses on thermal transport through the thickness of the semiconductor chip from the active surface to the passive surface. The passive surface, in turn, is attached to the chip mount pad of a metallic leadframe so that the thermal energy can flow into the chip mount pad of the metallic leadframe. The layer of the typical polymer attach material represents a thermal barrier. When properly formed, the leadframe can act as a heat spreader to an outside heat sink. In many semiconductor package designs, this implies a leadframe with a portion formed such that this portion protrudes from the plastic device encapsulation; it can thus be directly attached to the outside heat sink. Examples are described in U.S. Pat. No. 5,594,234, issued on Jan. 14, 1997 (Carter et al., "Downset Exposed Die Mount Pad Leadframe and Package") and U.S. Pat. No. 6,072,230, issued on Jun. 6, 2000 (Carter et al., "Bending and Forming Method of Fabricating Exposed Leadframes for Semiconductor Devices").

Another approach of known technology, specifically for ball-grid array devices without leadframes, employs a heat spreader spaced in proximity of the active surface of the semiconductor chip, at a safe distance from the electrical connections of the active surface. In this approach, the heat has to spread first through the macroscopic thickness of the molding material (typically an epoxy filled with inorganic particles, a mediocre thermal conductor) and only then into a metallic heat spreader. Frequently, the spreader is positioned on the surface of the molded package; in other devices, it is embedded in the molded package, as described in U.S. Pat. No. 6,552,428, issued on Apr. 22, 2003 (Huang et al., "Semiconductor Package having an Exposed Heat Spreader").

For leadless devices with small outlines (both relative to area consumption and device height), the application of any one of these thermal approaches is aggravated by the need for robustness during the encapsulation process, especially in transfer molding or injection molding methods. Any thermal advancement has to be low-cost, since cost-adding technical proposals are contrary to the strong market emphasis on total semiconductor device package cost reduction.

SUMMARY OF THE INVENTION

A need has therefore arisen to for a concept of a low-cost, thermally improved and electrically high performance leadless structure. In addition, a general semiconductor package structure is needed which based on fundamental physics and design concepts flexible enough to be applied for different semiconductor product families and a wide spectrum of design and assembly variations. It should not only meet high thermal and electrical performance requirements, but should also achieve improvements towards the goals of enhanced process yields and device reliability.

The present invention provides improved thermal performance of integrated circuits, especially of the SON, SOIC, SOP, and PDIP families, solving one of the most intractable limitations of semiconductor technology. One embodiment of the invention is a semiconductor device comprising a metallic leadframe with a first surface and a second surface. The leadframe includes a chip pad and a plurality of segments; the chip pad is held by a plurality of straps, wherein each strap has a groove. A chip is mounted on the chip pad and electrically connected to the segments. A heat spreader is disposed on the first surface of the leadframe; the heat spreader has its central portion spaced above the chip connections, and also has positioning members extending outwardly from the edges of the central portion so that they rest in the grooves of the straps. Encapsulation material surrounds the chip, the electrical connections, and the spreader positioning members, and fills the space between the spreader and the chip, while leaving the second leadframe surface and the central spreader portion exposed.

The base metal for both the leadframe and the heat spreader is preferably copper. The preferred thickness range for leadframe as well as spreader is between about 300 and 150 μm. The depth of the grooves in the chip pad straps are preferably about half the leadframe thickness.

Preferably, the heat spreader has a three-dimensional dome-like shape to approximate, together with the metallic chip pad, an almost closed thermally conductive shell surrounding the chip. Further, the heat spreader has preferably at least one groove formed so that it enhances the adhesion to the encapsulation material.

In another embodiment of the invention, a heat sink is in contact with the central spreader portion. In yet another embodiment of the invention, another heat sink is in contact with the second surface of the leadframe.

It is a technical advantage of the invention that it offers low-cost design and structure options for semiconductor packages to create short paths of steepened temperature gradient in order to dissipate the heat flux away from high-temperature IC portions to (outside) heat sinks.

It is another technical advantage that the innovation of the invention is accomplished using the installed equipment base so that no investment in new manufacturing machines is needed.

The technical advances represented by the invention, as well as the objects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. Pat. No. 6,597,065, issued on Jul. 22, 2003 (Efland, "Thermally Enhanced Semiconductor Chip having Integrated Bonds over Active Circuits").

Figure 1:
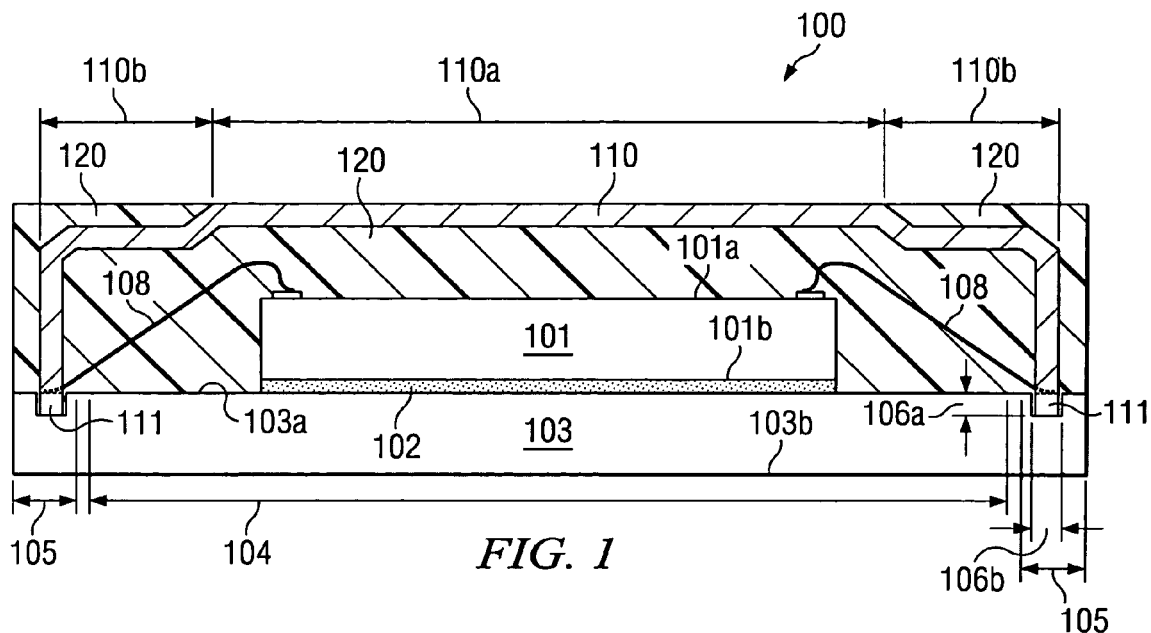
FIG. 1 is a schematic X-ray view of a packaged semiconductor device illustrating an embodiment of the invention. The X-ray view of FIG. 1 includes a cross section along line A–A' in FIG. 2.

FIG. 1 is a schematic X-ray view of a packaged semiconductor device, generally designated 100, illustrating an embodiment of the invention. Chip 101 is mounted by an adhesive chip attach material 102 onto the first surface 103a of a metallic leadframe 103. Attach adhesive 102 is thermally conductive; preferably, it is a silver-filled epoxy. The semiconductor material of chip 101 is preferably silicon; alternatively, chip 101 may comprise silicon germanium, gallium arsenide, or any other semiconductor material used for device fabrication.

Chip 101 has an active surface 101a, which comprises components such as integrated circuits, discrete transistors and diodes, and also passive parts including capacitors and resistors. Active surface 101a generates the thermal energy/heat during device operation, which needs to be transported away in order to maintain the preferred operation temperatures and to prevent overheating of the active components.

The most effective way of removing thermal energy is by conduction; less effective, but nevertheless welcome mechanisms include thermal transport by convection and by radiation. In quantitative terms, the energy transport by thermal conductance is expressed by a differential equation, which expresses, following FOURIER's approach, the thermal flux Q per unit of time as being the product of thermal conductivity $\lambda$ multiplied by the gradient of temperature T, in the direction of decreasing temperature, and by the area q perpendicular to the temperature gradient:

$$dQ/dt = -\lambda \cdot (\text{grad } T) \cdot q.$$

In this equation, Q is the vector (in magnitude and direction) of thermal flux, and $\lambda$ is the thermal conductivity, a materials characteristic. The thermal flux is in the direction of the temperature difference and is proportional to the magnitude of that difference.

When, over the length l, the temperature drop is steady and uniform from the high temperature T2 to the low temperature T1, then (grad T) reduces to (T2−T1)/l:

$$dQ/dt = -\lambda \cdot (q/l) \cdot (T2-T1).$$

$\lambda \cdot (q/l)$ is called the thermal conductance, and the inverse value $1/(\lambda \cdot q)$ is called thermal resistance (in analogy to OHM's law).

In the present invention, improvements of both $\lambda \cdot q$ and (grad T) are simultaneously provided to enhance the thermal flux vertically away from the heat-generating active components on the active surface 101a of the semiconductor chip 101.

In addition to this enhanced thermal flux vertically away from the active chip surface, there is the traditional possibility of conducting thermal energy in the opposite direction through the semiconductor material chip 101 to its passive surface 101b and beyond into leadframe 103. Through the second surface 103b of leadframe 103, the thermal flux can enter the ambient or an attached substrate.

Leadframe 103 is made of a base metal, preferably copper or a copper alloy. Alternative base metals include brass, aluminum, iron-nickel alloys (such as "Alloy 42"), and invar. Frequently, the base metal is fully covered with a plated layer; as an example, the copper base metal may be plated with a nickel layer.

[As defined herein, the starting material of the leadframe is called the "base metal", indicating the type of metal. Consequently, the term "base metal" is not to be construed in an electrochemical sense (as in opposition to 'noble metal') or in a structural sense.]

The base metal of leadframe 103 originates with a metal sheet in the preferred thickness range from 100 to 300 µm; thinner sheets are possible. The ductility in this thickness range provides the 5 to 15% elongation that facilitates the segment bending and forming operation. The leadframe is stamped or etched from the starting metal sheet.

As stated above, the base metal of leadframe 103 may often be plated, for instance with a nickel layer. The plated layer is preferably rough, non-reflective nickel having a thickness between 0.2 and 1.0 µm, preferably 0.5±25 µm. Nickel is the preferred metal because, positioned under the tin-based solder of contemporary devices, it reduces the propensity for tin whiskers. The plated nickel layer is ductile for the leadframe bending and forming process.

Figure 2:
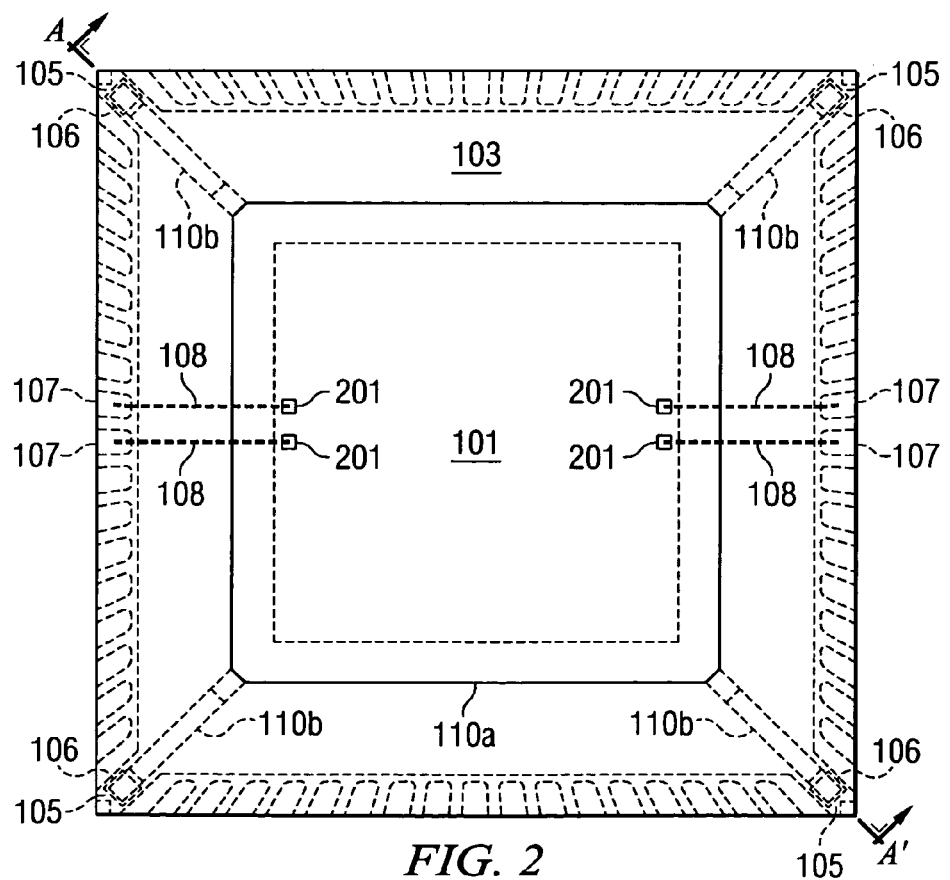
FIG. 2 is a schematic top view of the semiconductor device shown in FIG. 1, illustrating an embodiment of the invention.

The X-ray view of FIG. 1 includes a cross section along line A–A' of the device depicted in FIG. 2. Consequently, the material of leadframe 103 appears continuous in FIG. 1, but actually includes the chip pad 104 and a plurality of straps 105, which hold the chip pad 104. Each strap 105 has a groove 106 (see FIG. 2) of depth 106a and width 106b. Preferably, the depth 106a of the strap groove is approximately one half of the thickness of the leadframe material, resulting in a depth of about 50 to 150 µm. Not shown in FIG. 1 is the plurality of leadframe segments 107 (they are, however, clearly represented in FIG. 2). The semiconductor chip 101 is electrically connected the leadframe segments; as an example, FIG. 1 depicts a couple of wire bonds 108 serving as chip connections between the chip contact pads and the leadframe segments (not shown).

FIG. 1 further shows a heat spreader 110, which is disposed on the first surface 103a of the leadframe. Heat spreader 110 has a central portion 110a spaced above chip 101 and the chip connections 107. Further, heat spreader 110 has a plurality of positioning members 110b, which extend outwardly from the edges of the central portion 110a and rest in the grooves 106 of the leadframe straps 105. The heat spreader is preferably made of copper in a thickness range comparable to the metal of the leadframe 100 to 300 µm).

Typically, the heat spreader is stamped and formed form sheet metal; in this process, the positioning members 110b obtain a configuration, which provides strong anchoring of the encapsulation material onto the heat spreader. An example of suitably formed members with at least one curving for encapsulation adhesion is schematically illustrated in FIG. 1; this FIG. further shows the manner, in which the tips 111 of the members are positioned in the strap grooves 106. Using the depth of the grooves, this positioning secures a strong enough anchoring of the heat spreader to withstand any pressure of the molding compound during the transfer molding process.

In its final form, the heat spreader 110 comprises a three-dimensional bell-shaped metal part. Together with the metallic chip pad 104 of the leadframe, the bell-shaped heat spreader approximates for the device 100 an integrated, thermally strong conductive shell surrounding chip 101.

Device 100 is packaged by encapsulation material 120, which surrounds chip 101, the electrical connections 108, and the spreader positioning members 110b. The encapsulation material fills the space between spreader 110 and chip 101, but leaves the second leadframe surface 103b and the central spreader portion 110 exposed. The preferred encapsulation material is a molding compound containing thermally conductive fillers.

The cross section of FIG. 1 is taken along line A–A' of FIG. 2; FIG. 2 itself is a schematic top view of an embodiment of the present invention, wherein dashed lines indicate device features inside the plastic encapsulation. 110a outlines the central portion of the heat spreader. The four positioning members 110b extend outwardly from the edges of the central portion to rest in the grooves 106 of the straps 105 of the leadframe chip pad. The chip 101, mounted on the pad 103, has a plurality of contact pads 201, of which only four pads are shown in FIG. 2 for clarity. Bonding wires 108 connect the chip pads 201 to the leadframe segments 107; for clarity, only four bonding wire connections out of the plurality of segments are shown in FIG. 2.

Figure 3:
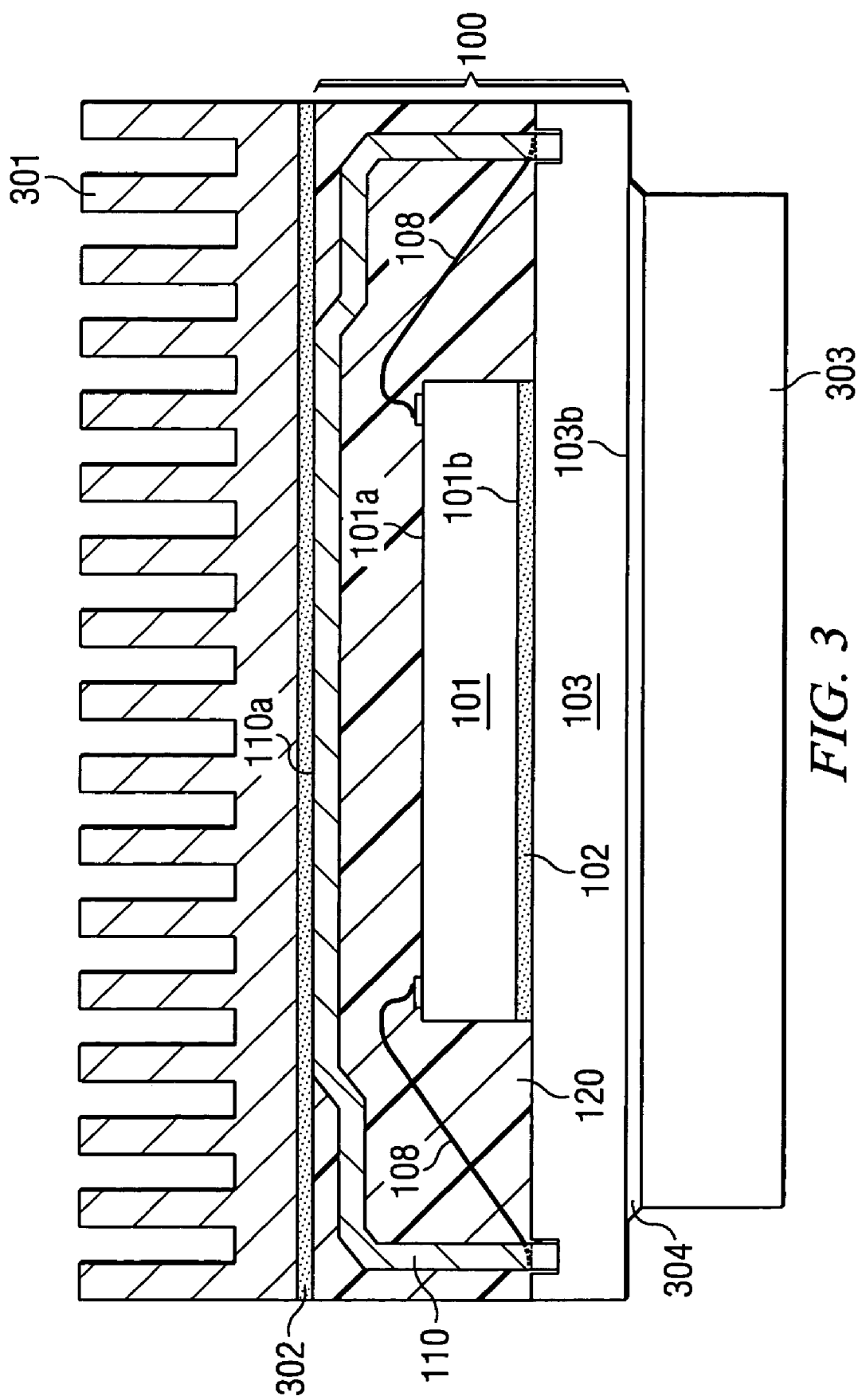
FIG. 3 is a schematic X-ray view and cross section of a semiconductor device illustrating another embodiment of the invention.

In the schematic cross section of FIG. 3, the device 100 of FIG. 1 is shown with heat sinks attached, actually, FIG. 3 depicts two heat sinks, but for some applications, one sink is sufficient. The first heat sink 301 is mounted, by means of attach material 302, on the device surface having the exposed central portion 110a of heat spreader 110. The second heat sink 303 is mounted, by means of attach material 304, on the leadframe surface having the exposed surface 103b of chip pad 104. Heat sinks 301 and/or 303 provide a steep temperature gradient (grad T) for enhancing the thermal flux away from the heat-generating active components on the active chip surface 101a. At the same time, the combination of metallic leadframe and metallic heat spreader with their high thermal conductivity λ and large area q perpendicular to the temperature gradient, improves the product λ·q.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the invention covers integrated circuits made in substrates of silicon, silicon germanium, gallium arsenide, or any other semiconductor material used in integrated circuit manufacture.

As another example, the invention covers generally a heat-generating semiconductor unit. This concept thus includes single-chip as well as multi-chip devices. Further, the concept includes devices employing wire-bonded assembly as well as flip-chip assembly.

It is therefore intended that the appended claims encompass any such modifications or embodiments.

We claim:

1. A semiconductor device comprising:
    a metallic leadframe having a first surface and a second surface, said leadframe including a chip pad and a plurality of segments;
    a plurality of straps holding said chip pad, each strap having a groove;
    a semiconductor chip mounted on said chip pad and electrically connected to said segments;
    a heat spreader disposed on said first surface of said leadframe, said heat spreader comprising a central portion spaced above said chip connections, and positioning members outwardly extending from edges of said central portion to rest in said grooves of said straps; and
    encapsulation material surrounding said chip, electrical connections, and spreader members, filling said space between said spreader and chip, while leaving said second leadframe surface and said central spreader portion exposed.

2. The device according to claim 1 wherein said heat spreader further comprises a three-dimensional bell shape to approximate, together with said metallic chip pad, a closed, thermally conductive shell surrounding said chip.

3. The device according to claim 1 wherein said heat spreader further comprises at least one curving to enhance adhesion to said encapsulation material.

4. The device according to claim 1 further including a first heat sink in contact with said central spreader portion.

5. The device according to claim 1 further including a second heat sink in contact with said second surface of said leadframe.

6. The device according to claim 1 wherein said leadframe is made of copper or copper alloy.

7. The device according to claim 1 where said leadframe material is selected from a group consisting of brass, aluminum, iron-nickel alloys, and invar.

8. The device according to claim 1 wherein said leadframe has a thickness in the range from about 100 to 300 μm.

9. The device according to claim 1 wherein said chip pad has four straps.

10. The device according to claim 1 wherein said strap grooves have a depth approximately one half of the thickness of the leadframe material.

11. The device according to claim 1 wherein said heat spreader is made of copper.

12. The device according to claim 1 wherein said heat spreader material has a thickness in the range from about 100 to 300 μm.

13. The device according to claim 1 wherein said heat spreader has four positioning members.

14. The device according to claim 1 wherein said chip is mounted on said chip pad by means of a thermally conductive adhesive.

15. The device according to claim 1 wherein said encapsulation material is a molding compound having thermally conductive filler material.

16. An apparatus comprising:
    a metallic leadframe having a first surface and a second surface, said leadframe including a pad for mountaining a heat-generating object; a plurality of segments operable to anchor connections to said object;
    a plurality of steps holding said pad, each strap having a groove; and
    a heat spreading disposed on said first surface of said leadframe, said heat spreader comprising a portion spaced above said pad, and positioning members outwardly extending from the edges of said portion to rest in said grooves of said straps.

* * * * *